United States Patent [19]

Magarshack

[11] Patent Number: 5,294,841
[45] Date of Patent: Mar. 15, 1994

[54] METHOD OF SHIFTING THE PHASE OF AN ELECTRICAL SIGNAL AND A PHASE-SHIFTER BASED ON THIS METHOD

[75] Inventor: John Magarshack, Rueil Malmaison, France

[73] Assignee: Thomson Composants Microondes, Puteaux, France

[21] Appl. No.: 813,781

[22] Filed: Dec. 27, 1991

[30] Foreign Application Priority Data

Dec. 28, 1990 [FR] France .................. 90 16434

[51] Int. Cl.[5] .................. H03F 3/68; G01R 25/04
[52] U.S. Cl. .................. 307/262; 307/511; 328/55; 328/155
[58] Field of Search ............... 307/511, 512, 513, 262; 328/155, 55; 333/138, 139, 172; 375/67, 83

[56] References Cited

U.S. PATENT DOCUMENTS

| | | | |
|---|---|---|---|
| 3,725,686 | 4/1973 | Ustach | 328/133 |
| 4,506,231 | 3/1985 | Green, Jr. et al. | 330/129 |
| 4,532,478 | 7/1985 | Silagi | 328/162 |
| 4,631,492 | 12/1986 | Magarshack et al. | 330/277 |
| 4,682,127 | 7/1987 | Magarshack | 333/103 |
| 4,721,985 | 1/1988 | Pavlidis et al. | 357/15 |
| 4,806,888 | 2/1989 | Salvage et al. | 333/138 |
| 4,857,777 | 8/1989 | Altes | 307/511 |
| 5,012,321 | 4/1991 | Magarshack et al. | 357/71 |

FOREIGN PATENT DOCUMENTS 0308844 3/1989 European Pat. Off. .

*Primary Examiner*—Timothy P. Callahan
*Attorney, Agent, or Firm*—Oblon, Spivak, McClelland, Maier & Neustadt

[57] ABSTRACT

A method of phase-shifting an electrical signal (E) of given amplitude and phase angle. The basic function in the method comprises vectorial adding ($\Sigma$) of the two input signals (E1, E2) of the same amplitude but with different phase angles, an operator to correct the amplitude of the vectorial sum ($\Sigma 1$), and an operator (C) to select one of the three signals (E1, E2, $\Sigma 1$), which have different phase angles. The phase-shifter operates iteratively until the required phase-shift is obtained. All applications, mainly in the microwave range, to radars, telecommunications, etc.

5 Claims, 3 Drawing Sheets

METHOD OF SHIFTING THE PHASE OF AN ELECTRICAL SIGNAL AND A PHASE-SHIFTER BASED ON THIS METHOD

BACKGROUND OF THE INVENTION

This invention is a digital method of changing the phase angle of an analog electric signal. It can be applied to all signal frequencies but is particularly suitable for microwave frequencies. The invention is also a phase-shifter which uses this phase-shifting method.

Many applications require an electrical signal with a certain difference in phase angle (leading or lagging) between itself and another identical electric signal. This applies, for example, to PSK (Phase Shift Keying) modems (modulators-demodulators) used in telecommunications or the modules for electronic sweep radar antennas. In most cases, the frequencies vary from the intermediate range (MHz) up to the microwave range (GHz) and the phase-shifters are either relatively sensitive to technological discrepancies or are limited in bandwidth.

DESCRIPTION OF THE PRIOR ART

It is common to use an analog phase-shifter whose principle is illustrated in FIG. 1. If OE is a vector representing an input signal E of amplitude 1 and phase angle 0, we know how to produce a phase-shifted signal, represented by vector "c" of amplitude 1 and phase angle $\phi$; this can be done by controlling the vector amplitudes "a" and "b". However, this analog phase-shifter is somewhat unreliable since it is sensitive to outside parameters.

Phase-shifters, as illustrated in FIG. 2, in which delay lines are switched into/out of circuit by PIN switches, are also known to industry. A signal E, with a certain phase angle, is applied in parallel to a direct line and a line whose length can be varied by placing line sections L, L/2, L/4, etc.—long in or out of circuit by switches $\Sigma 1$, $\Sigma 2$, $\Sigma 3$, etc. When a switch is closed (for example $\Sigma 2$), it short-circuits an element of the line (L2), which is therefore temporarily not in circuit. When a switch is open (for example $\Sigma 1$, $\Sigma 3$), signal E is delayed by line elements (L, L/4) which make the line longer than the direct line. This digital phase-shifter outputs two signals E and $\overline{E}$ whose phase angle differs by an amount which depends on the number of line elements switched into circuit. The length of these line elements means the phase-shifter takes up a large area on an integrated circuit, even though its bandwidth is limited, and is mainly used for microwave frequencies where the short wavelength means the switched line sections are also short.

SUMMARY OF THE INVENTION

This invention proposes a phase-shifting method based on iterative vectorial addition. The resultant phase-shifter comprises at least one basic function divided into three operators or, in terms of the method itself, three successive operations:

a vectorial adder sums two signals equal in amplitude but different in phase. The phase angle of the output signal is mid-way between the two input signal phase angles but its amplitude is different, a limiter or amplifier modifies the output signal amplitude to be equal to that of the input signals, a switch selects one of the three signals i.e. the two input signals and the output signal.

If this operation is repeated several times, the number of signals available for selection increases each time and thus the accuracy of the phase-shift also increases.

The phase-shifter includes a first initiation circuit which, from a single input signal E, generates four output signals with different phase angles:

two $\Sigma$ output signals $\Sigma = E$ and $\overline{\Sigma}$ in phase opposition,
two Q output signals at 90° to $\Sigma = E$ and $\Sigma$ with $\overline{Q}$ in phase opposition to Q.

In more precise terms, the invention is a method of changing an electrical signal phase angle which comprises:

an initiation operation in which two circuits transform an input signal with a given phase angle and amplitude into four electrical signals with the same amplitude but with phases at 90° to each other, one of these having the same phase angle as the input signal, at least one vectorial adding operation in which two signals of the same amplitude but with different phase angles are selected from the signals output by the initiation operation and are vectorially added to give a signal whose phase angle equals half the sum of the phase angles of the two selected signals but whose amplitude is different and must be modified to obtain the amplitude of the input signal, one of the input signals or the corrected vectorial sum, these three signals having different phase angles, being selected by a switch at output.

BRIEF DESCRIPTION OF THE DRAWINGS

The invention will be better understood upon reading the following description of the method and two examples of phase-shifters, referring to the appended figures of which:

The invention is based on vectorial adders, which are known devices, but the phase-shifting accuracy is achieved by repetitive or multiple vectorial addition and depends on the number of operators or bits. FIGS. 3 to 9 serve to explain the basis of this phase-shifting method.

If we consider two vectors E1 and E2 of the same amplitude but with a different phase angle, it is known that their vectorial sum is a vector $\Sigma$ whose phase angle is one half the sum of the phase angles of E1 and E2 but whose amplitude varies depending on the phase angle. In FIG. 3, the amplitude of vectorial sum $\Sigma$ is greater than that of E1 or E2 while in FIG. 4 its amplitude is less than that of E1 or E2; $\Sigma = E1 = E2$ is an exception, true only when the phase angles are equal to or multiples of 120°.

Vectors E1 and E2 can be electrical signals and, by convention, signal E2 is considered to be shifted from signal E1.

Figure 1:
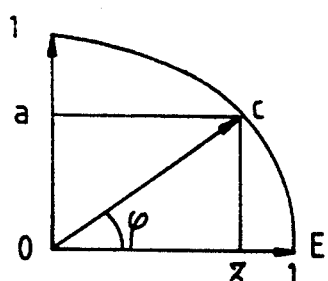
FIGS. 1 and 2 represent the basic methods used for analog or digital phase-shifting in the prior art, as explained previously.
Figure 2:
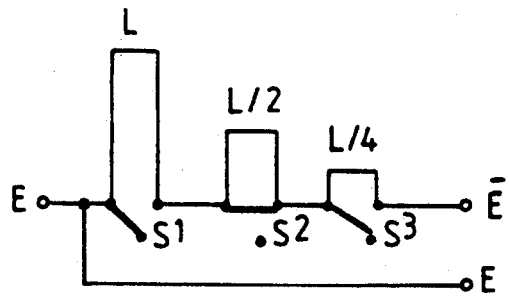
Figure 3:
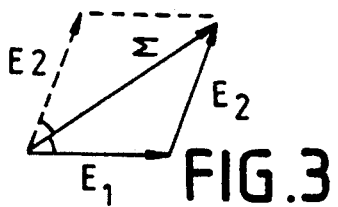
FIGS. 3 to 5 represent the basic digital phase-shifting method used in the invention, FIGS. 6 to 9 schematically represent the vectorial sums obtained by the phase-shifting method used in the invention.
Figure 4:
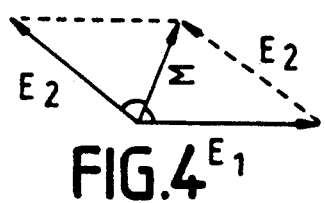
Figure 5:
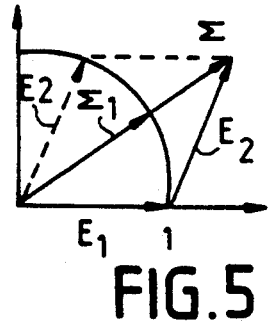

The first operation in the method is therefore to vectorially add two signals E1 and E2 which are equal in amplitude but different in phase (FIG. 3 or 4). The second operation, represented in FIG. 5, is to modify the sum obtained to give it the same unit amplitude Σ1 as input signals E1 and E2. Consequently, Σ must be limited, as shown in FIG. 5 which corresponds to FIG. 3, or, in the case of FIG. 4, it must be amplified.

Figure 6:
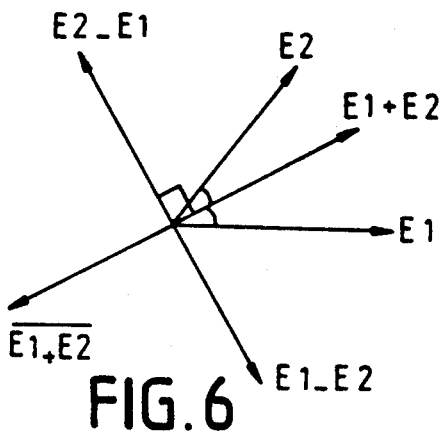

Moreover, methods of obtaining vectors at 90° or in phase-opposition to an initial vector, using simple electrical circuits, are well known. In the example shown in FIG. 6, which uses the same vectors E1 and E2 with two different phase angles, it is possible to obtain the vectorial sum E1+E2 and the vectorial differences E1−E2 and E2−E1 at 90° and in phase-opposition to the sum E1+E2. We can also obtain vector $\overline{E1+E2}$ in phase opposition to E1+E2; consequently, from the two phases of E1 and E2, we have now determined six phase angles.

The third operation is to select two of the vectors available or two of the phase angles available, which is effectively the same thing, to carry out another vectorial addition and thus obtain new phase angles. This choice is made by a switch which, for each basic function, is capable of choosing E1, E2 or their sum. Iterating this operation gives a phase shift whose accuracy increases as the number of operators in the phase-shifter increases.

It must, however, be remembered that the method described involves adding two signals E1 and E2 while a phase-shifter outputs a signal Σ whose phase is shifted, by a determined amount, from that of a single input signal E. The method therefore requires a preliminary operation and the phase-shifter includes a preliminary operator, referred to as "initiation", i.e. an operation which initiates the multiplication of the number of phase angles available.

Figure 7:
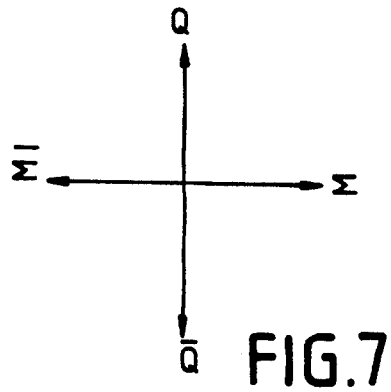

Starting with an electric signal E, it is easily possible to obtain 4 signals Σ,$\overline{\Sigma}$, Q and as shown in FIG. 7, which are at 90° or in phase opposition to one of the four, as required.

Figure 10:
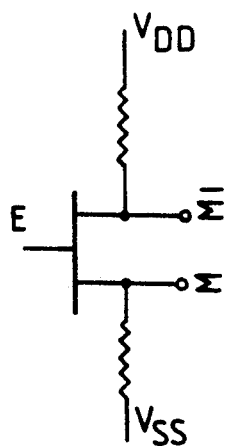
FIGS. 10 and 11 are diagrams of the initiation circuit in a phase- shifter according to the invention.

For example, applying two voltages $V_{DD}$ and $V_{ss}$ to the source and drain of a simple field-effect transistor, as shown in FIG. 10, is sufficient to obtain two signals in phase-opposition. It is known that, if signal E is applied to the transistor gate, the output signal Σ on the source is in phase-opposition to the output signal $\overline{\Sigma}$ on the drain.

Figure 11:
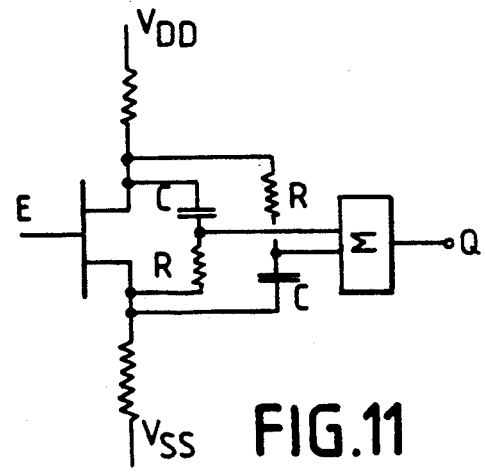

In addition, it is known that, if two RC phase-shifting circuits, in parallel but reversed relative to each other, are connected between the source and drain of the same transistor, as shown in FIG. 11, the outputs are equi-phased about Q which is at 90° to input signal E and their vectorial sum is always at 90° regardless of the frequency. To obtain $\overline{Q}$ from Q, we apply an inverter as shown in FIG. 10. In the case of this invention, it is preferable for Q and $\overline{Q}$ to be at 90° to Σ and $\overline{\Sigma}$.

This makes it possible to generate, from a single input signal E, four signals Σ,$\overline{\Sigma}$, Q and $\overline{Q}$ which cover phase-shift angles between 0° and 360° as shown on FIG. 7: this is the purpose and function of the initiating operator.

From these four phases, the subsequent operators multiply the number of phase angles available, i.e. the phase-shift relative to the input signal E phase angle, by repeatedly adding and then amplifying or limiting the signals as illustrated in FIGS. 3 and 5.

Figure 8:
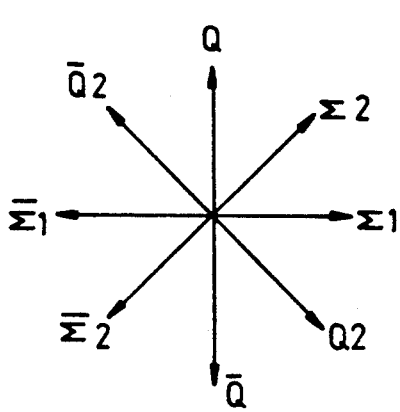
Figure 9:
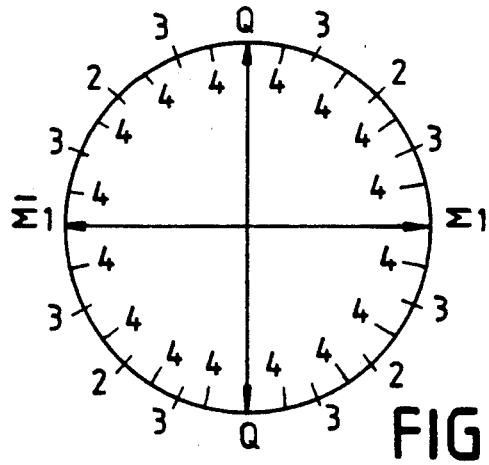

Consequently, FIG. 8 shows the phase angles available at output from the second operator: there are 8. In the same way, FIG. 9 shows the phase angles available at output from the fourth operator. To simplify this figure, the numbers 2, 3 and 4 indicate the various Σ and Q ($\overline{\Sigma}$ and $\overline{Q}$) phase angles available at the output from the second, third and fourth operators respectively.

Figure 12:
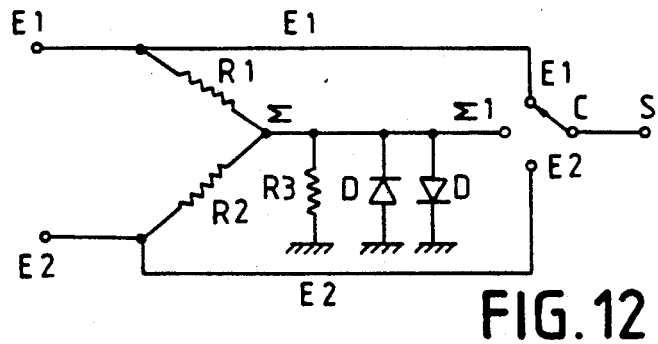
FIG. 12 is a circuit diagram of according to baseshifter according to the invention.
Figure 13:
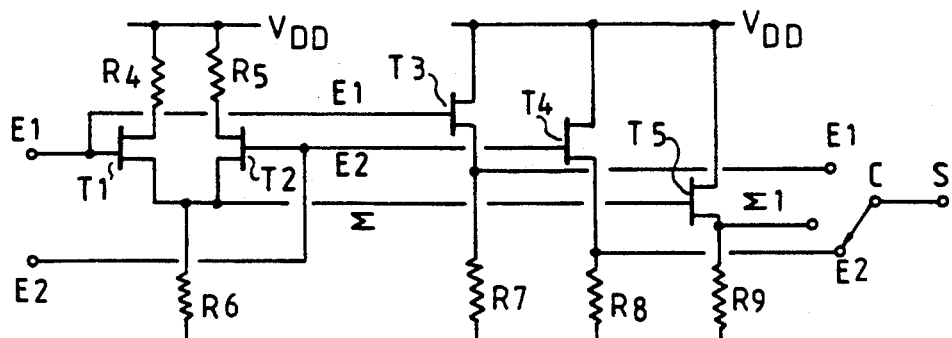

The basic circuit of a phase-shifter complying with the invention is shown in passive form in FIG. 12 and in active form in FIG. 13.

The basic circuit shown in FIG. 12 comprises:

an adder stage, consisting of two resistors R1 and R2 which generate the sum Σ=E1+E2 of the two input signals E1 and E2, a limiting stage, consisting of a resistor R3 and two diodes D, connected in reverse parallel, to correct Σ to amplitude Σ1, a switching stage consisting of switch C which selects one of the three signals E1, E2 and S1 to be applied to output S. This means that the phase angle of output Σ is the same at that of either E1, E2 or Σ1 and its amplitude is the same as E1 and E2.

The basic circuit shown in FIG. 13, which uses transistors, is a more general application: depending on whether the amplifier gain is <1 or >1, it is either a limiter (for the case shown in FIG. 3) or an amplifier (FIG. 4). It also comprises:

an adder stage, consisting of two transistors T1 and T2 fed through resistors R4, R5 and R6. Signals E1 and E2 are applied to the gates of these transistors and the sum Σ=E1+E2 is available on the common point of the T1 and T2 sources, an amplifier-limiter stage consisting of three transistors T3, T4 and T5 connected in parallel. Input signals E1 and E2 are applied, for example, to the gates of T3 and T4, which must have a unit gain to avoid modifying the amplitude of E1 and E2. The sum Σ is applied to the gate of T5 which then outputs a signal Σ1 whose amplitude is corrected to unity, a switching stage, consisting of a switch C whose function is identical to that shown in FIG. 12. However, the switch is represented symbolically: for example, the second gate in two-gate transistors could be used for switching.

In the two cases shown in FIGS. 12 and 13, the position of the amplifier-limiter and switching stages can be reversed; the preferred position mainly depends on the manufacturing technology.

Using the two initiating circuits shown in FIGS. 10 and 11 and one of the two basic circuit described above, it is possible to construct a digital phase-shifter whose accuracy is limited solely by the number of operators connected in cascade.

Figure 14:
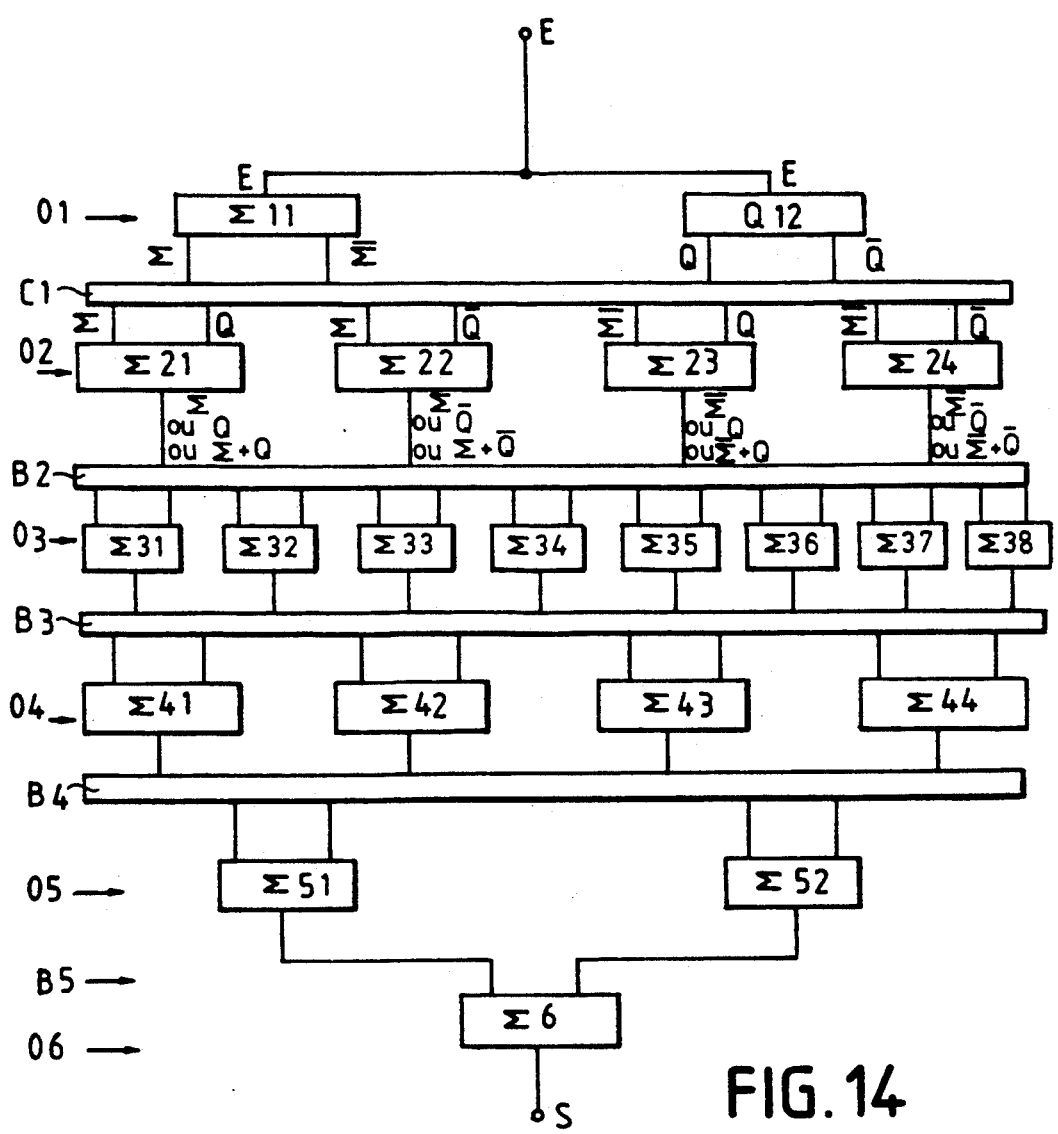
FIG. 14 is a block diagram of a phase-shifter according to the invention in which a tree structure is used.

FIG. 14 shows a phase-shifter with a tree structure. To simplify the diagram, the basic circuits in FIGS. 12 and 13 are represented by $\Sigma_n$ blocks and the interconnections between operators $O_n$ represented by buses $C_n$.

In this digital phase-shifter according to the invention, input signal E is applied to the two inputs to the initiation operator O1. This operator consists of circuit Σ11, that is a transistor phase-shifter as shown in FIG. 10, and circuit Q12 which is a 90° transistor phase-shifter as shown in FIG. 11. These two circuits Σ11 and Q12 are connected in parallel; the initiation operator O1 therefore outputs four signals Σ,$\overline{\Sigma}$, Q and $\overline{Q}$ spaced at 90°: these are the signals shown in FIG. 7.

Switching stage C1 distributes these four signals with different phase angles in pairs to the eight inputs to the four basic circuits Σ21 to Σ24 in second operator O2.

For each of these basic circuits, as shown in FIGS. 12 and 13, the phase-shifted input signals are Σ, $\overline{\Sigma}$, Q and $\overline{Q}$, taken in pairs, and the output signals downstream of the switch are selected from Σ, $\overline{\Sigma}$, Q, $\overline{Q}$, Σ+Q, $\overline{\Sigma}$+$\overline{Q}$, $\overline{\Sigma}$+Q, Σ+$\overline{Q}$: there are therefore 8 signals with different phase angles on bus B2 and the bus distributes them to the sixteen inputs to eight basic circuits Σ31 to Σ38 in the third operator O3.

This is a recurrent structure, repeated with as many operators as necessary to obtain the required accuracy in the phase difference between the output signal S and the input signal E. However, it must be remembered that the phase-shift accuracy is improved at each operation. Consequently, the tree structure is, to a certain degree, symmetrical and, in the last operators, each operator On+1 has only half the basic circuits $\Sigma_{n+1}$ as the previous operator $O_n$.

Figure 15:
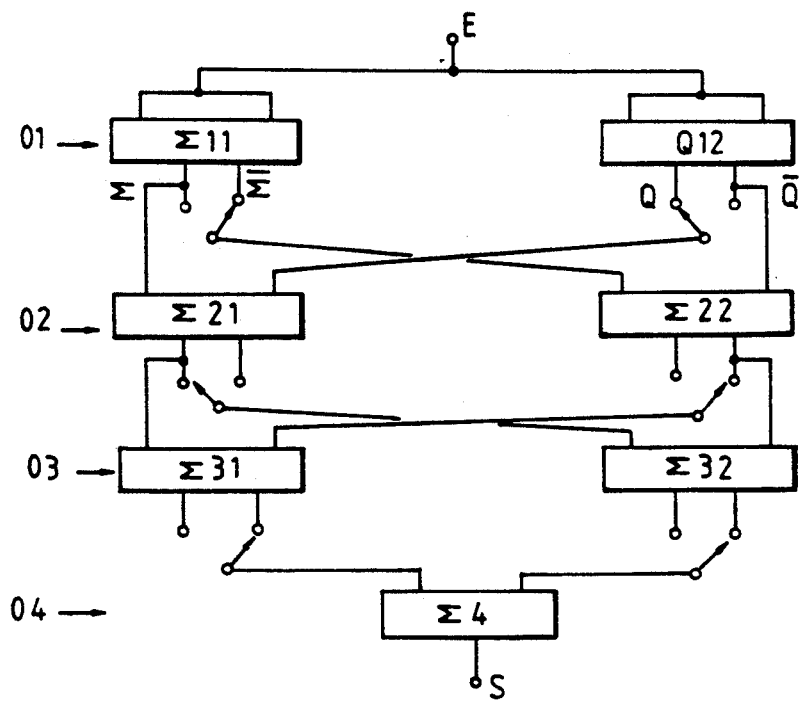
FIG. 15 is a block diagram of a phase-shifter according to the invention using a pipeline structure.

FIG. 15 shows a phase-shifter according to the invention but with a pipeline structure. As in the previous case, it is simpler to represent each basic circuits by a block.

The initiation operator O1 is identical to that in the tree-structure phase-shifter and it generates four output signals, at 90°, Σ, $\overline{\Sigma}$, Q and $\overline{Q}$ from an input signal E.

However, the phase-shifter then produces the required phase shift by successive approximation and each operator $O_n$ has only two basic circuits; one of its two inputs is wired (for example, the Σ and $\overline{Q}$ inputs in the example shown) and the other is selected by a switch. The last operator, O4 is this example, has only one basic circuit Σ4 which outputs a signal S hose phase angle differs by the required value from that of the input signal E.

The preferred embodiments of a phase-shifter according to the invention will be in microwave applications for radio transmission, radars or telecommunications. In its active form, it is easy to integrate into silicon or GaAs chips.

What is claimed is:

1. A method for phase-shifting electrical signals, comprising the steps of:

vertically adding a first electrical signal having a given amplitude and phase angle to a second electrical signal having an amplitude equal to that of said first electrical signal and a phase angle different from that of said first electrical signal by inputting said first and second electrical signals to the gate regions of a pair of first and second field-effect transistors, respectively, in order to thereby produce a third electrical signal having a phase angle mid-way between the phase angles of said first and second electrical signals and an amplitude which is different from said first and second electrical signals;

forming a fourth electrical signal by correcting the amplitude of said third electrical signal by presenting said first, second and third electrical signals as the inputs to the gate regions of third, fourth and fifth field-effect transistors, respectively, wherein the outputs of said third, fourth and fifth field-effect transistors represent the first, second and fourth electrical signals, respectively, such that the amplitude of said fourth electrical signal is made equal to that of said first and second electrical signals;

selecting one of said first, second and fourth electrical signals as an output signal.

2. The method according to claim 1, further comprising the steps of:

transforming an input signal, having a given amplitude and phase angle, into four electrical signals of equal amplitude and different phase angles 90° apart from each other, wherein one of said four electrical angles has the same phase as said input signal;

summing two of said four electrical signals produced from said transformation of said input signal in order to thereby generate a vectorial sum having a phase angle which is half the sum of the phase angles of said two selected signals, and also having an amplitude which is different from the amplitude of said two selected signals, said amplitude of the vectorial sum having been corrected so as to be equal to the amplitude of said input signal, one of said two selected signals or the corrected vectorial sum, wherein the input signal, said two selective signals and said corrected vectorial sum have phase angles different from each other; and selecting one of said input signal, said two selected signals and said corrected vectorial sum as an output signal using a switching means.

3. A phase-shifter for shifting electrical signals, comprising:

an initiation operator, including:

a first circuit comprising a first field-effect transistor having a gate region for receiving an input signal with a given amplitude and phase angle, said field-effect transistor further including source and drain regions for outputting first and second signals, respectively, said first signal being in phase with said input signal and said second signal being in phase-opposition with said input signal, and a second circuit including a second field-effect transistor having a pair of phase-shift RC circuits connected across source and drain regions of said second field-effect transistor, said second field-effect transistor outputting first and second signals at said source and drain regions thereof, respectively, said first and second signals output by said second field-effect transistor being in phase opposition to each other and electrically at 90° in phase difference from the first and second signals output by said first field-effect transistor;

a switching means for selecting at least two of said four signals output by the first and second field-effect transistors of the initiating operator, wherein said four signals have equal amplitudes and different phase angles from each other;

a vectorial adder including at least a basic function circuit including a first stage for vectorially adding said second signals, a second stage for correcting the vectorial sum produced in said first stage to an amplitude equal to said two selected signals, and a third stage for outputting one of said two selected signals and said vectorial sum, each of which has a different phase angle.

4. A phase-shifter according to claim 3, further comprising:

a plurality of adding operators connected in cascade, each of said plurality of adding operators including one or more basic function circuits, wherein said phase-shifter is symmetrical such that a first portion of said adding operators generates a range of phase angles and a second portion thereof selects two phase angles from said range of phase angles for application to an output operator such that an output signal is phase-shifted by a desired angle from the phase of said input signal.

5. The phase-shifter according to claim 3, wherein a plurality of said adding operators are connected in cascade and each adding operator includes first and second basic function circuits for outputting a signal which is phase-shifted from said input signal by a desired amount via an output operator which has a single basic function circuit.

* * * * *